US010024923B2

(12) United States Patent
Eitel et al.

(10) Patent No.: US 10,024,923 B2
(45) Date of Patent: Jul. 17, 2018

(54) DEVICE AND METHOD FOR INTERFACING A VEHICLE-EXTERNAL TESTING DEVICE TO A BATTERY REMOVED FROM A VEHICLE

(71) Applicant: Robert Bosch GmbH, Stuttgart (DE)

(72) Inventors: Peter Eitel, Esslingen (DE); Xin Wang, Esslingen Am Neckar (DE); Stefan Wickert, Albershausen (DE); Andreas Walter, Vaihingen (DE); Philipp Hagemann, Schorndorf (DE); Guenter Siegel, Schorndorf Weiler (DE)

(73) Assignee: ROBERT BOSCH GMBH, Stuttgart (DE)

( * ) Notice: Subject to any disclaimer, the term of this patent is extended or adjusted under 35 U.S.C. 154(b) by 108 days.

(21) Appl. No.: 15/037,140

(22) PCT Filed: Oct. 9, 2014

(86) PCT No.: PCT/EP2014/071600
§ 371 (c)(1),
(2) Date: May 17, 2016

(87) PCT Pub. No.: WO2015/078630
PCT Pub. Date: Jun. 4, 2015

(65) Prior Publication Data
US 2016/0282419 A1     Sep. 29, 2016

(30) Foreign Application Priority Data
Nov. 28, 2013    (DE) .................... 10 2013 224 344

(51) Int. Cl.
*G01N 27/416*     (2006.01)
*G01R 31/36*     (2006.01)
*G01R 31/00*     (2006.01)

(52) U.S. Cl.
CPC ..... *G01R 31/3644* (2013.01); *G01R 31/3627* (2013.01); *G01R 31/3696* (2013.01); *G01R 31/007* (2013.01)

(58) Field of Classification Search
CPC .. B60L 11/1809; B60L 11/1816; B60L 11/18; B60L 11/1822; B60L 11/1844;
(Continued)

(56) References Cited

U.S. PATENT DOCUMENTS 7,598,743 B2 * 10/2009 Bertness .................. G01R 1/06
320/132
2004/0054503 A1 * 3/2004 Namaky .............. G01R 31/007
702/183
(Continued)

FOREIGN PATENT DOCUMENTS

CN     101782629 A    7/2010
CN     102252856 A    11/2011
(Continued)

OTHER PUBLICATIONS

International Search Report dated Feb. 16, 2015 of the corresponding International Application PCT/EP2014/071600, filed on Oct. 9, 2014.

*Primary Examiner* — Vinh Nguyen
(74) *Attorney, Agent, or Firm* — Norton Rose Fulbright US LLP; Gerard Messina

(57) ABSTRACT

Testing of a vehicle battery in a state removed from a vehicle, using a testing device that is fashioned for testing the vehicle battery installed in the vehicle using an on-board diagnostic interface of the vehicle. The device has: an interface to which a plug of the testing device can be connected, the plug being for connection to the on-board diagnostic interface of the vehicle; an electrical connecting device via which at least one electrical vehicle battery terminal of the vehicle battery is connectable to the device;
(Continued)

and an adapter device by which signals receivable from the electrical vehicle battery terminal of the vehicle battery via the connecting device are conductible to the interface in such a way that the signals at the interface for the testing device are capable of being tested via the plug corresponding to a configuration of the on-board diagnostic interface of the vehicle.

10 Claims, 2 Drawing Sheets

(58) Field of Classification Search
CPC .............. B60L 11/1846; B60L 11/1851; B60L 11/1861; B60L 3/0046; B60L 11/1864; B60L 11/1868; B60L 2230/40; B60L 2240/547; B60L 11/1827; B60L 11/184; B60L 11/1859; B60L 11/1877; B60L 11/1887; B60L 11/1888; B60L 3/00; B60L 3/0053; B60L 3/0061; B60L 3/0069; G01R 31/007; G01R 31/006; G01R 31/025; G01R 31/3627; G01R 31/343; G01R 31/3606; G01R 31/362; G01R 31/3624; G01R 13/02; G01R 15/12; G01R 19/0069; G01R 1/203; G01R 27/025; G01R 27/08; G01R 31/021; G01R 31/026; G01R 31/3644; G01R 31/3648; G01R 31/86; G01R 31/3696; G01R 31/3689; B60M 7/003; G06F 13/4068

See application file for complete search history.

(56) References Cited

U.S. PATENT DOCUMENTS

| | | |
|---|---|---|
| 2008/0315830 A1 | 12/2008 | Bertness |
| 2012/0119747 A1 | 5/2012 | Sauerwine et al. |
| 2015/0198669 A1* | 7/2015 | Larsson ............... G01R 31/343 324/765.01 |

FOREIGN PATENT DOCUMENTS

| | | |
|---|---|---|
| CN | 102307231 A | 1/2012 |
| CN | 202869827 U | 4/2013 |
| CN | 203276018 U | 11/2013 |
| WO | WO 2009/011875 A2 | 1/2009 |

* cited by examiner

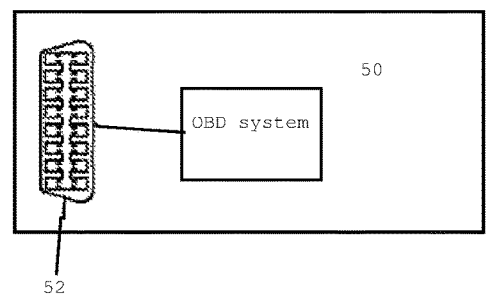
FIG. 1A (conventional)

DEVICE AND METHOD FOR INTERFACING A VEHICLE-EXTERNAL TESTING DEVICE TO A BATTERY REMOVED FROM A VEHICLE

FIELD

The present invention relates to a device and to a method for testing a vehicle battery in a state in which it is removed from a vehicle, using a testing device that is fashioned for testing the vehicle battery installed in the vehicle via an on-board diagnostic interface of the vehicle.

BACKGROUND INFORMATION

A vehicle battery is to be understood in particular as those batteries that, in hybrid or electric vehicles, have the function of supplying electrical energy to the drive train. Such vehicle batteries are standardly diagnosed in a workshop using a testing device, for example a diagnostic tester. Diagnostic testers are often fashioned generally for the diagnosis of vehicles. The connection of the testing device to the vehicle battery frequently takes place via a standardized on-board diagnostic (OBD) interface realized in the vehicle. Such a standard can for example be the OBD-I, OBD-II, OBD-1.5, or the EOBD standard.

In hybrid and electric vehicles, in case of error it is often necessary to remove the vehicle battery, for example a high-voltage battery. This removed vehicle battery has to be further tested or diagnosed with regard to its functionality in the state in which it is removed from the vehicle. The existing diagnostic infrastructure, in particular the testing device, can, generally, longer be used for the removed vehicle battery in the workshop, because the vehicle battery itself no longer has the on-board diagnostic interface.

PCT Published Application No. WO/2009 011875 A2 describes a method and a device for testing an electric vehicle. The device has a data bus connector that is capable of being connected to a data bus of the electric vehicle. The data bus can also be an OBD data bus. The device has in addition a microprocessor that can read out, via the data bus, voltage and current information about the data bus of the electric vehicle, and can diagnose the operation of the vehicle based on the read-out current and voltage information.

SUMMARY

An example device is provided for testing a vehicle battery in a state in which it is removed from a vehicle, using a testing device, the testing device being fashioned for testing the vehicle battery installed in the vehicle using an on-board diagnostic interface of the vehicle.

The example device has an interface to which can be connected a plug of the testing device fashioned for connection to the on-board diagnostic interface of the vehicle. The device has in addition an electrical connecting device by which at least one electrical vehicle battery terminal of the vehicle battery can be connected to the device.

In addition, the example device according to the present invention has an adapter device by which signals, that can be received from the at least one electrical vehicle battery terminal of the vehicle battery via the connecting device, can be conducted to the interface in such a way that the signals at the interface for the testing device are capable of being tested corresponding to the configuration of the on-board diagnostic interface of the vehicle. The expression "corresponding to the configuration of the on-board diagnostic interface" means in particular that the signals are present at the interface for the testing device in the way that the signals capable of being received from the at least one vehicle battery terminal of the vehicle battery would be present at the on-board diagnostic interface of the vehicle if the vehicle battery was still in the state in which it is installed in the vehicle. That is, the testing device obtains, for example at the plug, the same signals regardless of whether the plug is connected into the on-board diagnostic interface of the vehicle or into the interface of the device.

Signals going out from the testing device can also be received by the device via the interface corresponding to the configuration of the on-board diagnostic interface, and can be conducted to the connecting device via the adapter device. Via the connecting device, the signals going out from the testing device can be applied to the vehicle battery corresponding to the configuration of the on-board diagnostic interface. The expression "corresponding to the configuration of the on-board diagnostic interface" means in particular that the signals are coupled in at the interface for the testing device, and after being conducted through the adapter device via the connecting device to the vehicle battery are present at the vehicle battery, in the way that the signals would be present at the vehicle battery if the testing device were connected via the on-board diagnostic interface of the vehicle to the vehicle battery in its state in which it is installed in the vehicle.

In addition, an example method is provided for testing a vehicle battery in a state removed from a vehicle using a testing device that is fashioned for testing the vehicle battery installed in the vehicle using an on-board diagnostic interface of the vehicle. The method includes the steps: connection of at least one electrical vehicle battery terminal of the vehicle battery to an electrical connecting device; connection of a plug of the testing device to an interface, the plug being connectable for connection to the on-board diagnostic interface of the vehicle; conducting of signals that go out from the at least one electrical vehicle battery terminal of the vehicle battery to the interface in such a way that the signals at the interface for the testing device can be tested, via the plug, corresponding to the configuration of the on-board diagnostic interface of the vehicle; testing of the signals corresponding to the configuration of the on-board diagnostic interface of the vehicle.

The recognition on which the present invention is based is that workshops conventionally have technically sophisticated, highly specialized testing devices as diagnostic testers for testing vehicle batteries installed in a vehicle, but these testing devices cannot be used on vehicle batteries in a state removed from the vehicle, due to the missing on-board diagnostic interface.

In accordance with the present invention, this recognition is taken into account and a device by which an already-existing testing infrastructure, i.e., the testing device, can also be used on vehicle batteries removed from a vehicle, is provided. Here, the device fulfills at least an adapter function. In this way, the technical and financial outlay for additional diagnostic infrastructure elements for diagnosing removed vehicle batteries, and for transporting the vehicle battery for diagnosis and repair, can be minimized or entirely omitted.

According to a preferred embodiment, the connecting device of the device has at least one first voltage terminal and one second voltage terminal to which a voltage produced by the vehicle battery can be applied. In addition, the adapter device is connected to the voltage terminals and the interface in such a way and is fashioned such that at least the voltage applied between the voltage terminals for the testing device for testing the vehicle battery can be conducted to the interface in such a way that the voltage at the interface can be tested corresponding to the configuration of the on-board diagnostic interface. In this way, various high-voltage, but also low-voltage, outputs of the vehicle battery can be tested.

According to a further preferred development of the device, the device has a voltage supply terminal by which an operating voltage can be coupled into the device. Using the adapter device, the operating voltage can be conducted to the interface in such a way that the operating voltage for operating the testing device can be picked off at the interface. In this way, no further external energy source is required for the testing device. In addition, in this way it is also possible to use testing devices that expect a supply of energy via the on-board diagnostic interface of the vehicle.

Advantageously, a communication protocol by which the adapter device conducts the signals to the interface can be set based on specified and/or inputtable information via the vehicle battery. In this way, it is also possible to use testing devices that, for the functioning at the interface of the device, require information via a particular communication protocol. Such communication protocols can, for example, be battery-specific and/or vehicle-manufacturer-specific communication protocols. In the device, a data memory can be fashioned in which communication protocols can be pre-programmed and that are selected and used automatically by a communication protocol selection device of the device, for example based on data signals going out from the vehicle battery.

Alternatively or in addition, the device can have available to it a display and input device via which a communication protocol to be used can be inputted. Alternatively or in addition, . . . may also be inputted via the testing device that is connected to the interface of the device via the plug, via which communication protocol the adapter device conducts the signals to the interface. Through the specifiable and/or inputtable communication protocols, the device can be adjusted very flexibly to a large number of testing devices and/or vehicles and/or vehicle batteries.

According to a further preferred development, a circuit (FIG. 1, 51) by which the adapter device conducts the signals to the interface can be adjusted via the vehicle battery and/or via the vehicle, based on prespecified and/or inputtable information. In this way as well, the device can be adjusted very flexibly to a large number of testing devices and/or vehicles and/or vehicle batteries.

According to a further preferred development, the device has a charge control interface by which a charge device connected to the charge control interface can be controlled for the charging and/or discharging of the vehicle battery according to prespecified and/or specifiable charging parameters. The charge control interface can be connected to the interface of the device in such a way that the testing device can control the connected charge device using the charge control interface, for example for testing the vehicle battery. In this way, the testing of the vehicle battery can be carried out in a large number of situations and with a large number of parameters. The charge parameters can be automatically specifiable by the charge control interface, for example based on data signals going out from the vehicle battery. Thus, the device can be used as a charge device having an interface compatible with the on-board diagnostic interface.

According to a further preferred development, the device includes a charge device by which the vehicle battery can be charged and/or discharged via the connecting device. The advantages described above with reference to a connected charge device are in this way available even without an external charge device. The charge control interface can be fashioned additionally or also exclusively for controlling the charging and/or discharging of the vehicle battery using the charge device.

According to a further preferred development, the connecting device of the device includes at least one data terminal by which data can be received that can be outputted by at least one data output of the vehicle battery. The adapter device is connected to the at least one data terminal and to the interface in such a way, and is fashioned in such a way, that the data received via the data terminal for the testing device for testing the vehicle battery can be conducted to the interface in such a way that the data at the interface can be tested corresponding to the configuration of the on-board diagnostic interface.

According to a particularly preferred development, the device includes a simulation device (FIG. 1, 22) by which a vehicle simulation, in particular a vehicle residual simulation, can be carried out with prespecified and/or specifiable parameters. Vehicle simulation data of the vehicle simulation can be sent to the vehicle battery via the at least one data terminal. The vehicle simulation data can be made in such a way that the vehicle battery reacts to the vehicle simulation data as if it were situated in the vehicle with the prespecified and/or specifiable parameters. That is, the vehicle battery cannot recognize that it is not situated in the vehicle with the prespecified and/or specifiable parameters. The parameters can also be specified through inputs to the testing device that is connected to the device according to the present invention via the interface.

Vehicle batteries can for example have protective mechanisms according to which they open switches only if for example a cooling device of the vehicle provides a permission signal. If the closing of such a protective device is advantageous for testing the vehicle battery, then for example a vehicle simulation can be carried out by the simulation device (FIG. 1, 22) in which the cooling device is also simulated. The vehicle simulation data of the vehicle simulation can in this case include the permission signal of the simulated cooling device that can be sent to the vehicle battery. Further vehicle simulation data can for example include information concerning a temperature, a driving state of the vehicle, or the like. The parameters of the vehicle simulation can be prespecified, i.e. pre-programmed, but they can also be determined by a user and/or automatically.

BRIEF DESCRIPTION OF THE DRAWINGS

Below, the present invention is explained in more detail on the basis of the exemplary embodiments shown in the schematic Figures.

FIG. 1A shows a schematic block diagram of a conventional vehicle with an OBD system.

In all Figures, identical or functionally identical elements and devices have been provided with the same reference characters, unless otherwise indicated.

DETAILED DESCRIPTION OF EXAMPLE EMBODIMENTS

Figure 1:
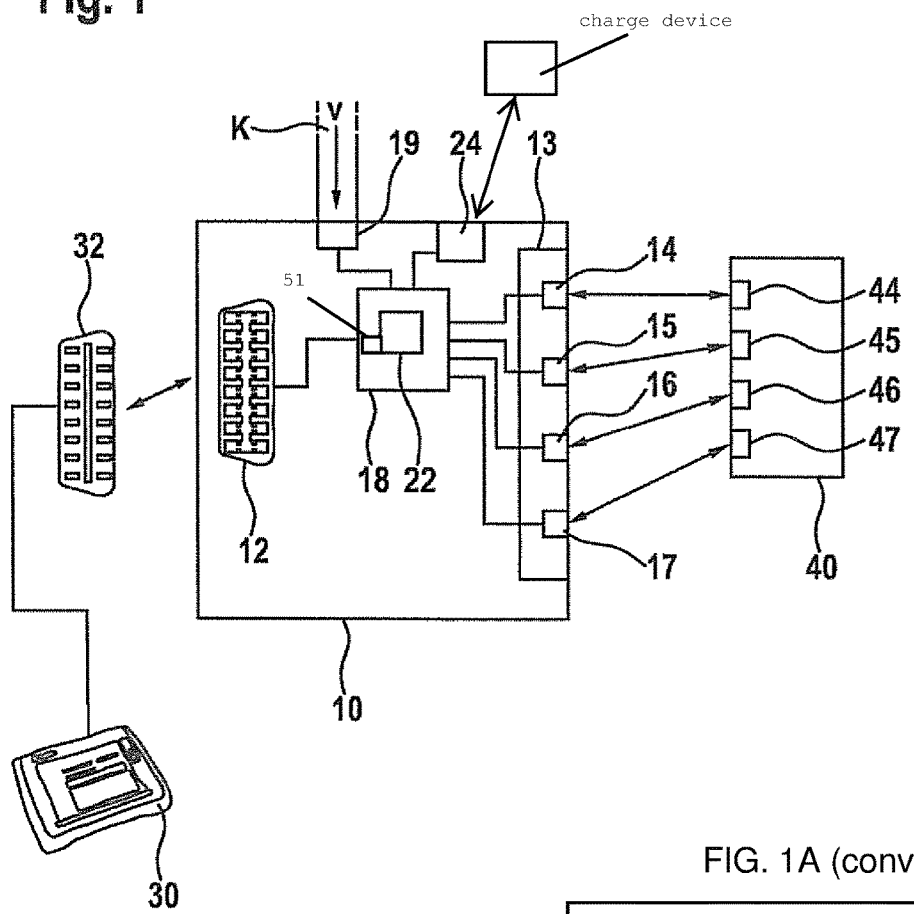
FIG. 1 shows a schematic block diagram of a device according to the present invention for testing a vehicle battery according to a first aspect of the present invention.

FIG. 1 shows a schematic block diagram of a device 10 according to the present invention for testing a vehicle battery 40 in a state removed from a vehicle 50 (FIG. 1A), using a testing device 30 that is fashioned for testing vehicle battery 40 installed in the vehicle 50 (FIG. 1A) using an on-board diagnostic interface 52 (FIG. 1A) of the vehicle 50 (FIG. 1A), according to a first aspect of the present invention.

In order to illustrate the method, in FIG. 1 testing device 30 and vehicle battery 40 are also shown. Double arrows symbolize how terminals are able to be connected to one another according to the first aspect. When, in the following text, it is stated that signals can be sent from vehicle battery 40 to device 10 and/or vice versa, and/or from testing device 30 to device 10 and/or vice versa, corresponding to a particular configuration, this is always to be understood as meaning that this is the case for an intended connection of testing device 30 to device 10, or of vehicle battery 40 to device 10.

The device has an interface 12 to which a plug 32 of testing device 30 can be connected that is fashioned for connection to the on-board diagnostic interface 52 (FIG. 1A) of the vehicle 50 (FIG. 1A). According to FIG. 1A, the on-board diagnostic interface 52 of the vehicle 50 is an OBD interface having the standardized OBD protocol. This can be OBD-I, OBD-1.5, or OBD-II. In FIG. 1, interface 12 is fashioned with an identical design to a female OBD connection port, while plug 32 of the testing device is fashioned as a male OBD connection port.

Interface 12 is connected to an adapter device 18 in such a way that, using adapter device 18, all contact pins of interface 12 can be individually charged with data signals and/or voltages. According to FIG. 1, device 10 additionally has a voltage supply terminal 19. An external supply cable K can be connected to a voltage supply terminal 19. An operating voltage V can be coupled into device 10 via supply cable K. Device 10 can for example be operated using operating voltage V.

Operating voltage V can also be conducted to interface 12 using adapter device 18 in such a way that operating voltage V, or at least a part of operating voltage V, can be picked off at interface 12 for the operation of testing device 30. For example, operating voltage V can be twelve volts or more, and testing device 30 can be operated with twelve volts of operating voltage V.

Device 10 has in addition a charge control interface 24 to which an external charge device can be connected. The charge device can be fashioned for the charging and/or discharging of vehicle battery 40. The charging and/or discharging of vehicle battery 40 using the external charge device can take place via an external cable between the charge device and vehicle battery 40, but can also take place via device 10, for example via adapter device 18, which is connected to a connecting device 13.

According to FIG. 1, connecting device 13 has a first voltage terminal 16 and a second voltage terminal 17. First and second voltage terminal 16, 17 are capable of being connected to a third and a fourth voltage terminal 46, 47 of vehicle battery 40, so that for example a voltage existing between third voltage terminal 46 and fourth voltage output 47, produced by vehicle battery 40, can be conducted to interface 12 via adapter device 18.

Via adapter device 18 and charge control interface 24, for the charging and/or discharging of vehicle battery 40 the external charge device can also apply a voltage to first and second voltage terminal 16, 17, and thus to third and fourth voltage terminal 46, 47 of vehicle battery 40. In this way, a control device of the vehicle battery can be supplied with voltage. Voltage terminals 46, 47 of vehicle battery 40 can in particular be high-voltage voltage terminals, for example a high-voltage input and a high-voltage output.

Connecting device 13 has in addition a first data terminal 14 by which data can be received that are capable of being outputted by at least one data output 44 of vehicle battery 40. In addition, connecting device 13 has a second data terminal 15 by which data can be sent to a data input 45 of vehicle battery 40. Data output 44 and/or data input 45 of vehicle battery 40 can for example be one or more low-voltage terminals that can in part also be fashioned for connection to a CAN bus or a comparable bus standard for vehicles.

Adapter device 18 is connected to first data terminal 14 and to interface 12 in such a way and is fashioned such that the data received via first data terminal 14 for testing device 30 for testing vehicle battery 30 are capable of being conducted to interface 12 in such a way that the data at interface 12 can be tested corresponding to the configuration of the on-board diagnostic interface.

In addition, adapter device 18 is connected to second data terminal 15 and to interface 12 in such a way and is fashioned such that data that can be received at interface 12 by testing device 30 corresponding to the configuration of the on-board diagnostic interface are capable of being conducted to second data terminal 15 in such a way that the data can be applied to data input 45 of the vehicle battery corresponding to the configuration of the on-board diagnostic interface.

The received data can for example include internal measurement data of vehicle battery 40, information concerning a manufacturer and/or a model of the vehicle battery and/or of the vehicle 50 (FIG. 1A), information concerning a communication protocol that is to be used or that can be used, and/or information concerning a circuit that is to be used or that can be used of adapter device 18.

Figure 2:
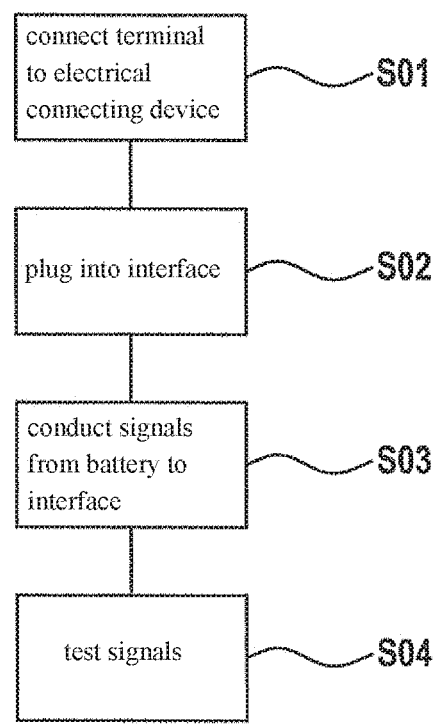
FIG. 2 shows a schematic flow diagram for explaining a method according to a second aspect of the present invention.

FIG. 2 shows a schematic flow diagram for explaining a method according to a second aspect of the present invention.

In a step S01, at least one electrical vehicle battery terminal 44, 45, 46, 47 of vehicle battery 40 is connected to an electrical connecting device 13, for example via a cable.

In a further step S02, a plug 32 of testing device 30 that is capable of being connected for connection to the on-board diagnostic interface 52 of the vehicle 50 is connected to an interface 12, for example by plugging the plug into the interface.

In a method step S03, signals going out from the at least one electrical vehicle battery terminal 44, 45, 46, 47 of vehicle battery 40 are conducted to interface 12 in such a way that the signals at the interface can be tested, via plug 32, corresponding to the configuration of the on-board diagnostic interface 52 of the vehicle 50.

In a step S04, the signals are tested corresponding to the configuration of the on-board diagnostic interface 52 of the vehicle 50, using testing device 30.

Although the present invention has been described above on the basis of preferred exemplary embodiments, it is not limited thereto, but rather can be modified in many ways. In particular, the present invention can be modified in many ways without departing from the core idea of the present invention.

For example, additional interfaces can be fashioned on device 10, for example a CAN bus interface, which make it possible for the device to communicate with further external devices, and/or to control these devices. These can be additional measurement inputs for diagnosis of vehicle battery 40.

A display screen can also be provided on the device. Using the display screen, for example a process of charging the vehicle battery by an external or internal charge device of the device can be graphically displayed. For the charge process, a characteristic curve can be specified, for example via an input device of the device, or via the connected testing device.

The invention claimed is:

1. A device for testing a vehicle battery in a state removed from a vehicle, using a vehicle-external testing device, the vehicle-external testing device being fashioned for testing the vehicle battery installed in the vehicle using an on-board diagnostic (OBD) interface of the vehicle, the OBD interface of the vehicle being a female OBD connection port in the vehicle for interfacing with an OBD system of the vehicle, the device comprising:
an interface to which a plug of the vehicle-external testing device is connectable, the interface being a female connector having a design which is the same as the female OBD connection port in the vehicle, the plug being fashioned for connection to the on-board diagnostic OBD interface of the vehicle, the plug being a male OBD connection port;
an electrical connecting device by which at least one electrical vehicle battery terminal of the vehicle battery is connectable to the device; and
an adapter device by which signals, received from the at least one electrical vehicle battery terminal of the vehicle battery via the electrical connecting device, are conducted to the interface in such a way that signals present at the interface for the vehicle-external testing device: (i) is testable by the vehicle-external testing device via the plug when the plug is connected to the interface and without use of the OBD system of the vehicle, and (ii) correspond to a configuration of the on-board diagnostic OBD interface of the vehicle;
wherein the device, including the interface, the electrical connecting device, and the adapter device, is vehicle-external.

2. The device as recited in claim 1, wherein the connecting device has at least one first voltage terminal and one second voltage terminal to which a voltage produced by the vehicle battery can be applied; and wherein the adapter device is connected to the voltage terminals and the interface in such a way and fashioned such that at least the voltage applied between the voltage terminals for the vehicle-external testing device for testing the vehicle battery is conductable to the interface in such a way that the voltage at the interface can be tested corresponding to the configuration of the on-board diagnostic OBD interface.

3. The device as recited in claim 1, further comprising:
a voltage supply terminal by which an operating voltage is couplable into the device, the operating voltage being capable of being conducted, via the adapter device to the interface, in such a way that the operating voltage is picked off at the interface for the operation of the vehicle-external testing device.

4. The device as recited in claim 1, wherein the adapter device adjusts a communication protocol by which the adapter device conducts the signals to the interface is adjustable based on at least one of: prespecified and specifiable information, at least one of via the vehicle battery, and via the vehicle.

5. The device as recited in claim 1, wherein further comprising:
a circuit by which the adapter device conducts the signals to the interface, the circuit being is capable of being adjusted based on information via the vehicle battery.

6. The device as recited in claim 1, further comprising:
a charge control interface by which a charge device connected to the charge control interface is controlled for at least one of a charging and a discharging, of the vehicle battery, according to at least one of prespecified and specifiable charge parameters.

7. The device as recited in claim 1, further comprising:
a charge device by which the vehicle battery is at least one of charged and discharged, via the electrical connecting device.

8. The device as recited in claim 1, wherein the connecting device has at least one data terminal by which data is receivable that can be output by at least one data output of the vehicle battery by the vehicle battery; and wherein the adapter device is connected to the at least one data terminal and the interface in such a way, and being fashioned such that, the data received via the data terminal for the vehicle-external testing device for testing the vehicle battery is conductable to the interface in such a way that the data is testable at the interface corresponding to the configuration of the on-board diagnostic OBD interface.

9. The device as recited in claim 1, further comprising:
a simulation device by which a vehicle simulation is carried out with one of prespecified and specifiable parameters; wherein vehicle simulation data of the vehicle simulation being sent to the vehicle battery via the electrical connecting device; and the vehicle simulation data being made such that the vehicle battery reacts to the vehicle simulation data as if the battery were located installed in the vehicle with the at least one of the prespecified and specifiable parameters.

10. A method for testing a vehicle battery in a state removed from a vehicle using a vehicle-external testing device that is fashioned for testing the vehicle battery installed in the vehicle using an on-board diagnostic (OBD) interface of the vehicle, the OBD interface of the vehicle being a female OBD connection port in the vehicle for interfacing with an OBD system of the vehicle, the method comprising:
providing a first device including an interface to which a plug of the vehicle-external testing device is connectable, the interface being a female connector having a design which is the same as the female OBD connection port in the vehicle, the plug being fashioned for connection to the OBD interface of the vehicle, the plug being a male OBD connection port, the first device further including an electrical connecting device by which at least one electrical vehicle battery terminal of the vehicle battery is connectable to the device, and the first device further including an adapter device by which signals, received from the at least one electrical vehicle battery terminal of the vehicle battery via the electrical connecting device, are conducted to the interface in such a way that signals present at the interface for the vehicle-external testing device: (i) is tested by the vehicle-external testing device via the plug when the plug is connected to the interface and without use of the OBD system of the vehicle, and (ii) correspond to a configuration of the OBD interface of the vehicle, the first device, including the interface, the electrical connecting device, and the adapter device, being vehicle-external;

connecting the at least one electrical vehicle battery terminal of the vehicle battery to an the electrical connecting device;

connecting, to the interface, the plug of the vehicle-external testing device to the on-board diagnostic interface of the vehicle; and conducting signals that go out from the at least one electrical vehicle battery terminal of the vehicle battery to the interface in such a way that the signals present at the interface for the vehicle-external testing device: (i) is tested by the vehicle-external testing device via the plug and without use of the OBD system of the vehicle, and (ii) correspond to a configuration of the on-board diagnostic OBD interface of the vehicle.

\* \* \* \* \*